United States Patent

Kotachi et al.

[11] Patent Number: 5,856,071
[45] Date of Patent: Jan. 5, 1999

[54] RESIST MATERIAL INCLUDING SI-CONTAINING RESIST HAVING ACID REMOVABLE GROUP COMBINED WITH PHOTO-ACID GENERATOR

[75] Inventors: Akiko Kotachi; Satoshi Takechi, both of Kawasaki, Japan

[73] Assignee: Fujitsu Limited, Kawasaki, Japan

[21] Appl. No.: 618,274

[22] Filed: Mar. 18, 1996

Related U.S. Application Data

[63] Continuation of Ser. No. 265,033, Jun. 24, 1994, abandoned.

[30] Foreign Application Priority Data

Sep. 24, 1993 [JP] Japan ..................................... 5-238503
Dec. 27, 1993 [JP] Japan ..................................... 5-331746

[51] Int. Cl.$^6$ ............................... G03C 5/16; G03C 1/73
[52] U.S. Cl. .................. 430/326; 430/270.1; 430/273.1; 430/323; 430/328; 430/330; 430/910
[58] Field of Search ................................ 430/270.1, 326, 430/910, 328, 330, 273.1, 323

[56] References Cited

U.S. PATENT DOCUMENTS

| | | | |
|---|---|---|---|
| 5,045,431 | 9/1991 | Allen et al. | 430/270 |
| 5,068,169 | 11/1991 | Takechi et al. | 430/326 X |
| 5,100,762 | 3/1992 | Tanaka et al. | 430/270 |
| 5,153,103 | 10/1992 | Kotachi et al. | 430/330 X |
| 5,326,670 | 7/1994 | Kotachi et al. | 430/326 X |
| 5,346,803 | 9/1994 | Crivello et al. | 430/270 |

FOREIGN PATENT DOCUMENTS

| | | |
|---|---|---|
| 0 178 208 | 4/1986 | European Pat. Off. . |
| 0 523 957 | 1/1993 | European Pat. Off. . |
| 2-191957 | 7/1990 | Japan . |
| 2-239251 | 9/1990 | Japan . |
| 3-217845 | 9/1991 | Japan . |
| 3-261952 | 11/1991 | Japan . |
| 3-289659 | 12/1991 | Japan . |
| 4-042229 | 2/1992 | Japan . |

OTHER PUBLICATIONS

Lamola et al., "Chemically Amplified Resists", Solid State Technology, Aug. 1991, pp. 53–60.
Reichmanis et al., "Chemical Amplification Mechanisms for Microlithography," Materials, 1991, vol. 3, No. 3 pp. 394–407.

*Primary Examiner*—Bernard P. Codd
*Attorney, Agent, or Firm*—Staas & Halsey

[57] ABSTRACT

A fine pattern is formed using a resist material including a copolymer of a silicon-containing acrylate and an acrylate which contains a group that is eliminated by an acid, and a photo-acid generator which generates the acid upon irradiation. The polarity of the material changes after elimination of this group and becomes soluble in an aqueous alkali solution.

6 Claims, No Drawings

RESIST MATERIAL INCLUDING SI-CONTAINING RESIST HAVING ACID REMOVABLE GROUP COMBINED WITH PHOTO-ACID GENERATOR

This application is a continuation of application Ser. No. 08/265,033, filed Jun. 24, 1994, now abandoned.

BACKGROUND OF THE INVENTION

1. Field of the Invention

This invention relates to a resist material, and a pattern forming process using the resist material. 2. Description of the Related Art As the integration density of semiconductor devices has become higher and higher in recent years, a resist material capable of forming a miniature pattern has been required.

In patterning processes, a technology called "two-layered resist process" has been employed which comprises the steps of forming a lower resist layer for levelling on a to-be-patterned material (to-be-etched material), then forming an upper resist layer, exposing this upper resist layer, developing, and transferring the resulting pattern to the lower resist layer to obtain a mask pattern. In this case, a resist material for constituting the upper resist layer must have performance capable of withstanding at least etching for transferring the pattern to the lower resist layer (generally $O_2$ RIE, that is, reactive ion etching using oxygen).

Polyacrylate type resists, polysiloxane type resists and polysilane type resists, have high etching resistance due to the introduction of silicon (Si) into an ester portion of the resist materials. They are known as the materials for the upper layer resist material in the multi-layer resist process described above (for example, Japanese Unexamined Patent Publication (Kokai) Nos. 2-191957, 2-239251, 3-217845, 3-261952 and 4-42229). In all of them, development is based on the difference of molecular weights between exposed area at the time and unexposed area. As a result, sharp patterning cannot be conducted and swell of the resist pattern occurs at the time of development, limiting their usefulness for obtaining miniature patterns. Because of the ever-increasing integration density of semiconductor devices, this is a significant drawback.

SUMMARY OF THE INVENTION

It is therefore an object of the present invention to provide a resist material capable of solving the problems with the prior art described above, and capable of forming a sufficiently miniature pattern, and a pattern forming process using such a resist pattern.

To accomplish the object described above, the present invention provides a resist material comprising a copolymer represented by the following general formula I and a photo-acid generator:

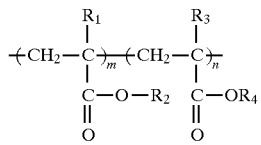

wherein each of $R_1$ and $R_3$ independently represents a hydrogen, alkyl having 1 to 4 carbon atoms, halogen, halogenated ($C_1$–$C_4$) alkyl, nitrile or phenyl, $R_2$ is a group represented by the following general formula II,

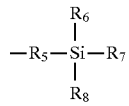

wherein $R_5$ is a $C_1$–$C_4$ alkylene, each of $R_6$, $R_7$ and $R_8$ independently represents a $C_1$–$C_4$ alkyl, halogenated ($C_1$–$C_4$) alkyl, phenyl or tri($C_1$–$C_4$)alkylsilyl($C_1$–$C_4$) alkyl;

$R_4$ is a group which is eliminated by an acid, and each of m and n is a positive integer.

DESCRIPTION OF THE PREFERRED EMBODIMENTS

In the copolymer represented by the general formula I, typical examples of the group $R_4$ eliminated by the acid are t-butyl, dimethylbenzyl, tetrahydropyranyl and 3-oxocyclohexyl.

The photo-acid generator useful for the present invention may include sulfonium salts, sulfonic acid ester compounds, iodonium salts and halogen compounds. Typical examples of the photo-acid generator include the following compounds:

sulfonium salts of the formula,

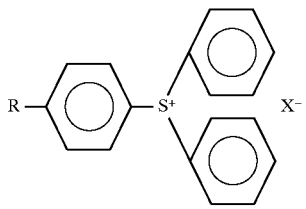

in which $X^-$ is $BF_4^-$, $PF_6^-$, $SbF_6^-$ or $CF_3SO_3^-$, and R is —H, —OCH$_3$ or

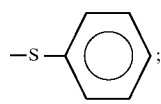

sulfonic acid ester compounds of the formulae,

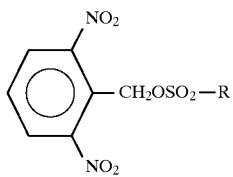

in which R is

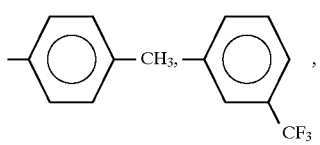

-continued

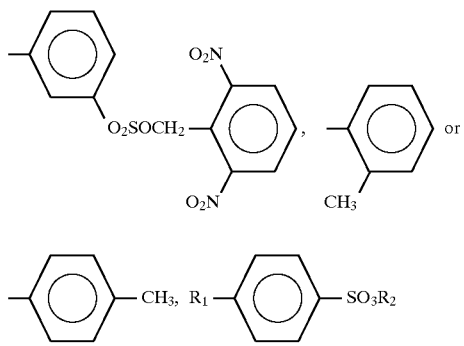

in which R, is —H or —CH₃, and R₂ is —C₄H₉,

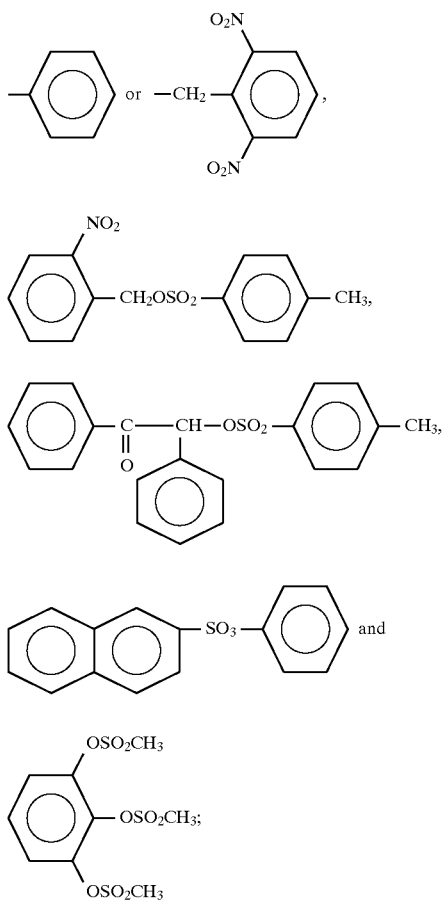

iodonium salts of the formula,

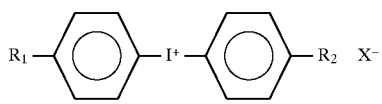

in which X⁻ is $BF_4^-$, $PF_6^-$, $SbF_6^-$ or $CF_3SO_3^-$, and $R_1$ and $R_2$ are each independently —H, —OCH₃ or —C(CH₃); and halogen compounds of the formulae,

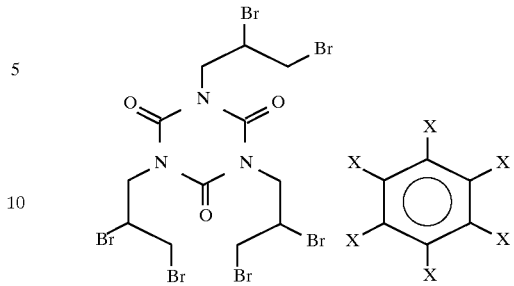

in which X is —Br or —Cl,

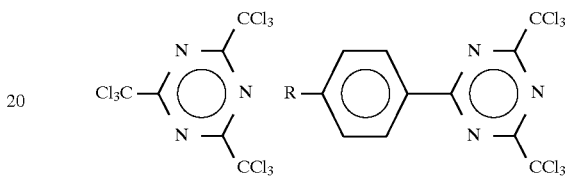

in which R is —H, —Cl or —OCH₃.

According to the present invention, there is also provided a pattern forming process which comprises the steps of coating the resist material described above on a substrate to form a resist layer, irradiating the resist layer, baking the irradiated resist layer, and developing the baked resist layer.

The resist material according to the present invention contains a copolymer of a silicon (Si)-containing acrylate and an acrylate which contains a group eliminated by an acid (protonic acid), the polarity of which changes after elimination of this group, and which then becomes soluble in an aqueous alkali solution (developing solution), as a base polymer. Further, this resist material contains a photo-acid generator which generates a protonic acid upon irradiation, which acts on the base polymer and generates conversion of the polarity, making the resist material soluble in the aqueous alkali developing solution (or a solution prepared by further adding $C_1$ to $C_8$ alcohol to the aqueous alkali developing solution).

In the development step according to the prior art described above which is based on differences of molecular weights, the resist material is not completely insoluble in the developing solution which is usually an organic solvent, even at the portion having a large molecular weight, but slightly dissolves or swells. For this reason, it is not possible to generate a large difference in developability between the exposed area and the unexposed area.

In the resist material according to the present invention, in contrast, development is effected on the basis of the difference of polarities between the exposed region and the unexposed regions, so that a clear difference occurs between the area soluble in the developing solution and the area insoluble in it. Further, according to the present invention, the region in which polarity conversion occurs can be developed by the aqueous alkali developing solution which does not cause swelling. Consequently, degradation of the exposed pattern can be restricted.

The resist material of the present invention described above is clearly suited for use as an upper resist layer of a multi-layered resist process. In other words, the lower layer resist pattern is formed by the steps of coating the resist material described above on the lower resist layer, which is in advance formed on the substrate, to form the upper resist layer, irradiating this upper resist layer, effecting baking and development so as to form a pattern of the upper layer resist, and then forming the lower layer resist pattern using this upper layer resist pattern as a mask. Formation of this lower layer resist pattern can be carried out by ordinary $O_2$ RIE (reactive ion etching using oxygen), by way of example.

The inventors of the present invention have further discovered that in such a multi-layer resist process, when the resist material of the present invention is used as the upper layer resist material, it becomes possible to prevent the decrease of the pattern line width during etching of the lower layer resist, even when the lower layer resist is thick. Accordingly, the present invention provides a pattern forming process which comprises forming an upper layer resist pattern by the process already described, irradiating the upper layer resist, effecting baking and then etching the lower layer resist. The irradiation by flood exposure not using a mask and heat-treatment may be conducted only for the upper layer resist pattern portion. Since it is practically difficult to conduct this treatment for only the upper layer, it is advisable to conduct the irradiation and baking on the entire surface of the resist layer inclusive of both the upper and lower resist layers forming the pattern. If necessary, the irradiation and baking may be carried out simultaneously.

The resist material according to the present invention has extremely high resolution, and is therefore suitable for ultra-miniature etching, in particular. However, when this material is used as the upper layer resist of the multi-layered resist, there occurs the problem that a sufficient effect can be obtained only when the film thickness of the lower layer resist as the to-be-etched material is small, such as below 1.5 μm. In other words, when a pattern is transferred to a lower layer resist having a film thickness of 2 μm, for example, a side etching degree corresponding to the upper layer resist pattern becomes more even when etching is effected by an anisotropic etching apparatus, and the line width of the upper layer resist pattern itself becomes slender, so that the line width of the resulting lower layer resist becomes slender. However, this problem can be solved by irradiating the upper resist layer after the upper layer resist pattern is formed, then effecting baking, subsequently etching the lower layer resist, and forming the pattern. It is believed that since the radiation exposed on the residual resist layer remaining as the upper layer resist pattern after patterning of the upper layer resist but before etching of the lower layer resist and then baking is conducted, the group which is eliminated by the acid is eliminated from the copolymer in this upper layer resist and as a result, the Si content remaining in the resist layer becomes relatively greater and etching resistance of this resist layer can be improved.

The inventors of the present invention have further found that the irradiation of the resist layer and subsequent baking advantageously function when the resist layer, comprising the resist material containing the Si-containing polymer and the photo-acid generator is peeled. Accordingly, the present invention further provides a process for peeling the layer made of the resist material containing the Si-containing polymer and a photo-acid generator, which comprises the steps of irradiating a layer of this resist material effecting baking and then subjecting the resist to a peeling step.

The Si-containing resist has resistance to oxygen plasma etching. The Si-containing resist is used particularly as the upper layer resist in a two-layered resist process, for forming a mask for etching the lower layer resist not containing Si. Generally, peeling of the resist not containing Si is conducted by ashing by oxygen plasma. However, since the Si-containing resist cannot be peeled by ashing by the oxygen plasma, peeling by a mixed gas of oxygen and $CF_4$ or $CHF_3$ has been proposed in the past, but this is not perfect. When the substrate to be etched is PSG or a thermal oxide film, for example, a mixture of $O_2$, $CF_4$ and $CHF_3$ is used as the etching gas. In this case, the upper layer resist and the substrate are etched simultaneously, but the etching of the upper layer resist is also not perfect. Therefore, a resist residue is formed from the upper layer resist. However, in the case where the Si-containing resist is rendered soluble by the function of the acid from the photo-acid generator at the exposed area and is removed and the pattern is formed by the resist at the unexposed area, the resist remaining as the pattern is rendered soluble by the function of the acid from the photo-acid generator when the treatment is carried out, after etching of the lower layer resist, in accordance with the present invention as described above, and consequently, peeling can be accomplished by the developing solution. On the other hand, in the case where the Si-containing group in the resist is eliminated by the acid from the photo-acid generator at the exposed area, the resist can be removed and the pattern is formed by the resist at the unexposed area, Si in the resist remaining as the pattern is eliminated from the resist when treatment is carried out in accordance with the present invention as described above, Si in the resist is eliminated from the resist remaining as the pattern and resistance to the $O_2$ plasma is lost. Accordingly peeling can be accomplished by ashing in the same way as in the case of the ordinary resist. In this case, the upper layer resist, too, is simultaneously peeled by this etching step for the lower layer resist without the peeling step of the upper layer resist, in particular. In this case, too, flood exposure by radiation and heat-treatment are preferably applied to the entire surface of the resist layer inclusive of the upper and lower resist layers forming the pattern, and the irradiation and baking may be carried out simultaneously.

Hereinafter, the present invention will be explained in further detail with reference to Examples.

EXAMPLE 1

Trimethylsilylmethyl methacrylate (TMSMMA) and dimethylbenzyl methacrylate (DBMA) were mixed in a ratio of 1:1 so as to prepare a toluene solution having a monomer concentration of 5.0 mol/liter. Next, 2 mol %, on the basis of the monomer of the toluene solution, of 2,2'-azobis (isobutylonitrile) (AIBN) was added to the solution, and the mixture was retained in an oil bath at 80° C. for 8 hours with stirring. Next, the mixture was left standing to cool at room temperature, was diluted with toluene and was thereafter dropped into large quantities of a methanol solution. The resulting precipitate was filtered and dried to obtain a base polymer as a resist material. There was thus obtained a trimethylsilylmethyl methacrylate/dimethylbenzyl methacrylate copolymer represented by the following formula,

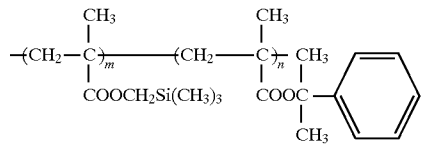

wherein each of m and n is a positive integer. In this example, the copolymer described above could be obtained at a yield of 60%, the molecular weight was 27,000 and the dispersion was 1.61.

Next, 15 wt %, on the basis of the base polymer described above, of triphenylsulfonium hexafluoroantimonate (TPSSbF$_6$) as a photo-acid generator was mixed with the base polymer, and a 7% solution of methyl isobutyl ketone (MIBK) was formed. In this way, the resist material of this example could be obtained.

EXAMPLE 2

Trimethylsilylmethyl methacrylate (TMSMMA) and tertiarybutyl methacrylate (TBMA) were mixed at a ratio of 1:1 so as to prepare a toluene solution having a monomer concentration of 5.0 mol/liter. Next, 2 mol %, on the basis of the monomer, of AIBN was added to the mixture, and the mixture was retained in an oil bath at 80° C. for 15 minutes. Next, the mixture was left standing to cool to room temperature. After the mixture was diluted with toluene, it was dropped into large quantities of a mixed solvent of water and methanol having a mixing ratio of 1:20, and the resulting precipitate was filtered and dried to obtain a base polymer of a resist material. There was thus obtained a trimethylsilylmethyl methacrylate/tertiarybutyl methacrylate copolymer represented by the following formula,

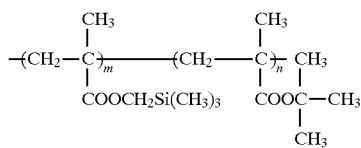

wherein each of m and n is a positive integer. In this example, the copolymer described above could be obtained at a yield of 80%, the molecular weight was 38,000 and the dispersion was 1.70.

Next, the resist material of this example was obtained using the base polymer in the same way as in Example 1.

EXAMPLE 3

Trimethylsilylmethyl methacrylate (TMSMMA) and tetrahydropyranyl methacrylate (THPMA) were mixed at a ratio of 1:1 so as to prepare a toluene solution having a monomer concentration of 5.0 mol/liter. Next, 2 mol %, on the basis of the monomer, of AIBN was added to the mixture, and the mixture was retained in an oil bath at 80° C. for 7 hours with stirring. Next, the mixture was left standing to cool to room temperature. After the mixture was diluted with toluene, it was dropped into large quantities of a mixed solvent of water and methanol having a mixing ratio of 1:20, and the resulting precipitate was filtered and dried to obtain a base polymer of a resist material. There was thus obtained a trimethylsilylmethyl methacrylate/ tetrahydropyranyl methacrylate copolymer represented by the following formula,

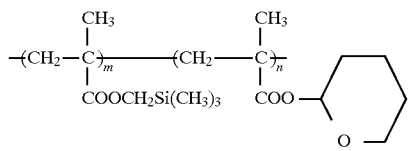

wherein each of m and n is a positive integer.

In this example, the copolymer described above could be obtained at a yield of 90%, the molecular weight was 28,000 and the dispersion was 1.75.

Next, the resist material of this example was obtained in the same way as in Example 1 using the base polymer described above.

EXAMPLE 4

1-methacryloxymethyl-1,1,3,3,3-pentamethyldisilylmethylene and dimethylbenzyl methacrylate were mixed at a mixing ratio of 1:1 so as to form a toluene solution having a monomer concentration of 5 mol/liter. Next, 2 mol %, on the basis of the monomer, of AIBN was added to the mixture, and the mixture was retained in an oil bath at 80° C. for 8 hours with stirring. Then, the mixture was left standing at room temperature to cool, and the reaction product was diluted with toluene. The toluene solution was dropped into large quantities of a mixed solvent of water and methanol having a mixing ratio of 1:20, and the resulting precipitate was filtered and dried to obtain a 1 - m e t h a c r y l o x y m e t h y l - 1 , 1 , 3 , 3 , 3 - pentamethyldisilylbenzylmethylene/dimethylbenzyl methacrylate copolymer represented by the following formula, at a yield of 65%. The molecular weight was 14,000 and the dispersion was 1.65.

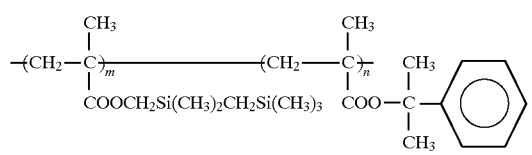

wherein each of m and n is a positive integer.

Next, the resist material of this example was obtained in the same way as in Example 1 using the base polymer described above.

EXAMPLE 5

Diphenylmethylsilyl methacrylate and dimethylbenzyl methacrylate were mixed at a mixing ratio of 1:1 so as to form a toluene solution having a monomer concentration of 5 mol/liter. Next, 2 mol %, on the basis of the monomer, of AIBN was added to the mixture, and the mixture was retained in an oil bath at 80° C. for 8 hours with stirring. Then, the mixture was left standing at room temperature to cool, and the reaction product was diluted with toluene. The toluene solution was dropped into large quantities of methanol, and the resulting precipitate was filtered and then dried to obtain a diphenylmethylsilyl methacrylate/ dimethylbenzyl methacrylate copolymer represented by the following formula, at a yield of 88%. The molecular weight was 20,000 and the dispersion was 1.74.

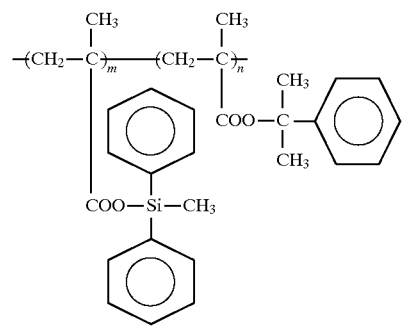

wherein each of m and n is a positive integer.

Next, the resist material of this example was obtained in the same way as in Example 1 using the base polymer described above.

EXAMPLE 6

3-oxocyclohexyl methacrylate and trimethylsilylmethyl methacrylate were mixed at a mixing ratio of 1:1 so as to form a toluene solution having a monomer concentration of 5 mol/liter. Next, 2 mol %, on the basis of the monomer, of AIBN was added to the mixture, and the mixture was retained in an oil bath at 80° C. for 5 hours with stirring. Thereafter, the mixture was left standing at room temperature to cool, and the reaction product was diluted with toluene. The toluene solution was dropped into large quantities of a mixed solvent of methanol and water having a mixing ratio of 20:1, and the resulting precipitate was filtered and dried to obtain a trimethylsilylmethyl methacrylate/3-oxocyclohexyl methacrylate copolymer represented by the following formula, at a yield of 57%. The molecular weight was 13,000 and the dispersion was 1.81.

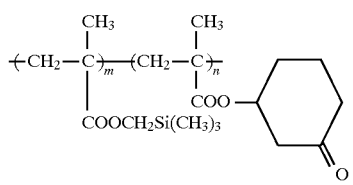

wherein each of m and n is a positive integer.

Next, the resist material of this example was obtained in the same way as in Example 1 using the base polymer described above.

EXAMPLE 7 t-butyl methacrylate and trimethylsilylmethyl acrylate were mixed at a mixing ratio of 1:1 so as to form a toluene solution having a monomer concentration of 5 mol/liter. Next, 2 mol %, on the basis of the monomer, of AIBN was added to the mixture, and the mixture was retained in an oil bath at 80° C. for 3 hours with stirring. Thereafter, the mixture was left standing at room temperature to cool, and the reaction product was diluted with toluene. The toluene solution was dropped into large quantities of a mixed solvent of methanol and water having a mixing ratio of 1:1, and the resulting precipitate was filtered and dried to obtain a trimethylsilylmethyl acrylate/t-butyl methacrylate copolymer represented by the following formula, at a yield of 85%. The molecular weight was 23,000 and the dispersion was 1.63.

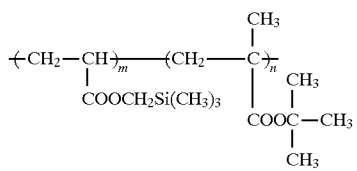

wherein each of m and n is a positive integer.

Next, the resist material of this example was obtained in the same way as in Example 1 using the base polymer described above.

EXAMPLE 8

After a novolak type photoresist was applied to a substrate, the substrate was hard baked at 200° C. so as to form a lower layer resist layer having a thickness of 1.5 μm. This lower layer resist layer had a function of levelling the unevenness on the substrate. Next, the resist material obtained in each of Examples 1 to 7 was applied to the surface of the lower resist layer and was then baked at 60° C. to form a 0.3 μm-thick upper resist layer.

Next, the upper resist layer described above was exposed to a predetermined pattern by using a KrF excimer laser (NA=0.45) as a light source.

One minute after the exposure described above, baking was carried out at 60° C. for the resist materials of Examples 1 and 4 to 7, at 100° C. in the case of the resist material of Example 2 and at 40° C. in the case of the resist material of Example 3, for 60 seconds, respectively. Then, each of the resist materials was developed by an alkali developing solution (NMD3, a product of Tokyo Oka Kogyo K. K.) or a solution prepared by adding isopropyl alcohol (IPA) or isobutyl alcohol (IBA) to the alkali developing solution, for one minute so as to pattern the upper resist layer. According to each resist material, a pattern corresponding to a line-and-space of 0.3 μm could be sufficiently resolved.

Next, the lower resist layer was etched by using the pattern of the upper layer resist layer as a mask. Oxygen etching ($O_2$ RIE) using a reactive ion etching apparatus of a parallel plate type was suitable for this etching. By this etching, the pattern of the upper resist layer could be transferred with fidelity to the lower resist layer.

The process steps described above could form the resist pattern with high accuracy on the substrate, and a miniature semiconductor structure could be formed.

EXAMPLE 9

This example used a product, as the resist, which was prepared by adding 15 wt %, on the basis of a resin, of triphenylsulfonium hexafluoroantimonate as a photo-acid generator to a copolymer of dimethylbenzyl methacrylate and trimethylsilylmethyl methacrylate (copolymerization ratio=1:1).

First, this resist was spin-coated onto a novolak type resist (film thickness: 2.0 μm) which was hard baked at 200° C. for one hour, and was pre-baked at 60° C. for 100 seconds (film thickness: 3,500 Å). This resist was then irradiated by a KrF excimer laser stepper (NA=0.45) and was then baked at 60° C. for 60 seconds. Thereafter, development was carried out by an aqueous alkali developing solution (NMD-3, a produced by Tokyo Oka Kogyo K. K.) to obtain an upper layer pattern. Next, on the entire surface of this resist was irradiated with the KrF excimer laser and baking was done once again at 60° C. for 60 seconds.

When transfer was made by $O_2$ RIE using this upper layer pattern as a mask to a lower layer having a thickness of 2.0 μm, transfer could be made with high accuracy to the lower layer.

COMPARATIVE EXAMPLE 1

The same procedures of Example 9 were followed except that irradiation of the entire surface after development and the baking step were omitted. When etching of the 2.0 μm-thick lower layer was completed, the residual film of the upper layer resist hardly existed, so that the pattern became slender, and a shift was severe.

COMPARATIVE EXAMPLE 2

Similar results could be obtained in the same way as in Comparative Example 1 when the film thickness of the lower layer in Comparative Example 1 was changed to 2.5 μm.

EXAMPLE 10

A novolak resist was coated onto a substrate consisting of PSG and was baked at 200° C. for 1 hour to form a lower resist layer. A Si-containing resist consisting of a trimethylsilylmethyl methacrylate/a dimethylbenzyl methacrylate copolymer and triphenylsulfonium hexafluoroantimonate as a photo-acid generator was coated and was then baked at 60° C. for 100 seconds so as to form a 0.3 μm-thick upper resist layer. This resist was irradiated by a KrF excimer laser stepper (NA=0.45) and was then baked at 60° C. for 60 seconds. Next, the upper resist layer was developed for one minute by an aqueous alkali developing solution (NMD-3, a product of Tokyo Oka Kogyo K. K.) and an upper layer resist pattern was obtained.

Next, the lower layer resist was etched by $O_2$ RIE, and a two-layered resist pattern was formed. The laser beam was irradiated again on the entire surface by the same KrF excimer laser stepper, and baking was again carried out at 60° C. for 60 seconds. When development was carried out by using the same aqueous alkali developing solution as described above, the upper layer resist could be peeled.

EXAMPLE 11

A novolak resist was coated onto a substrate consisting of PSG and was baked at 200° C. for one hour to form a lower layer resist layer having a thickness of 1.5 μm. A Si-containing resist consisting of a trimethylsilylmethyl methacrylate/t-butyl methacrylate copolymer and triphenylsulfonium hexafluoroantimonate as a photo-acid generator was coated and was then baked at 60° C. for 100 seconds so as to form an upper resist layer having a thickness of 0.3 μm. Next, this resist was exposed by a KrF excimer laser stepper (NA=0.45) and was baked at 100° C. for 60 seconds. The upper resist layer was developed for one minute by an aqueous alkali developing solution (NMD-3, a product of Tokyo Oka Kogyo K. K.) and an upper layer resist pattern was obtained.

Next, the lower layer resist was etched by $O_2$ RIE, and a two-layered resist pattern was formed. The laser beam again irradiated the entire surface, using the same KrF excimer laser stepper, and baking was again carried out at 100° C. for 60 seconds. When development was carried out using the same aqueous alkali developing solution for one minute, the upper layer resist could be peeled.

EXAMPLE 12

A novolak resist was coated onto a substrate consisting of PSG and was baked at 200° C. for one hour to form a lower layer resist layer having a thickness of 1.5 μm. A Si-containing resist consisting of a trimethylsilymethyl methacrylate/tetrahydropyranyl methacrylate copolymer and triphenylsulfonium hexafluoroantimonate as a photo-acid generator was coated and was baked at 60° C. for 100 seconds so as to form an upper resist layer having a thickness of 0.3 μm. Next, this resist was exposed by a KrF excimer laser stepper (NA=0.45) and was baked at 40° C. for 60 seconds. Next, the upper resist layer was developed for one minute by an aqueous alkali developing solution (NMD-3, a product of Tokyo Oka Kogyo K. K.) and a upper layer resist pattern was obtained.

Next, the lower layer resist was etched by $O_2$ RIE, and a two-layered resist pattern was formed. The laser beam again irradiated the entire surface, using the same KrP excimer laser stepper, and baking was again carried out at 60° C. for 60 seconds. When development was carried out using the same aqueous alkali developing solution for one minute, the upper layer resist could be peeled.

COMPARATIVE EXAMPLE 3

In the procedures described in Examples 10 to 12, development was carried out without exposing the entire surface after $O_2$ RIE and baking. In this case, the upper layer resist could not be peeled. When the resist was immersed into a coating solvent in place of the developing solution, the upper layer resist could not be peeled.

EXAMPLE 13

A novolak resist was coated onto a substrate consisting of PSG and was baked at 200° C. for one hour to form a lower resist layer having a thickness of 1.5 μm. A Si-containing resist consisting of polydimethylisopropylsilyl maleimide expressed by the formula given below and triphenylsulfonium hexafluoroantimonate as a photo-acid generator was coated on the lower resist layer, and was baked at 90° C. for 100 seconds to form an upper layer resist layer having a thickness of 0.3 μm:

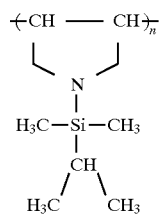

wherein n is a positive integer.

This resist was exposed by a KrF excimer laser stepper (NA=0.45), and was baked at 100° C. for 60 seconds. Next, the upper resist layer was developed for one minute by an aqueous alkali developing solution (NMD-3, a product of Tokyo Oka Kogyo K. K.), and an upper layer resist pattern was obtained.

Next, the lower resist was etched by $O_2$ RIE, and a two-layered resist pattern was formed. Next, the laser beam again irradiated the entire surface using the same KrF excimer laser stepper, and baking was again carried out at 100° C. for 60 seconds. When development was carried out using the same aqueous developing solution for one minute, the upper layer resist could be peeled.

EXAMPLE 14

A novolak resist was coated onto a substrate consisting of PSG, and was baked at 200° C. for one hour to form a lower resist layer having a thickness of 1.5 μm. A Si-containing resist consisting of silylated polyhydroxystyrene expressed by the formula given below and triphenylsulfonium hexafluoroantimonate as a photo-acid generator was coated onto this lower resist layer, and was baked at 90° C. for 100 seconds to form an upper layer resist layer having a thickness of 0.3 μm:

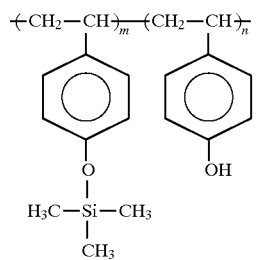

wherein each of m and n is a positive integer. This resist was exposed by a KrF excimer laser stepper (NA=0.45) and was baked at 100° C. for 60 seconds. Next, this upper resist layer was developed by an aqueous alkali developing solution (NMD-3, a product of Tokyo Oka Kogyo K. K.) for one minute, and an upper layer resist pattern was obtained.

Next, the lower layer resist was etched by O$_2$ RIE, and a two-layered resist pattern was obtained. The laser beam again irradiated the entire surface by the same KrF excimer laser stepper, and baking was again carried out at 100° C. for 60 seconds. When development was carried out with the same aqueous developing solution, the upper resist layer could be peeled.

EXAMPLE 15

In the procedures described in Examples 10 to 14, the laser beam irradiated the entire surface using the same KrF excimer laser stepper after O$_2$ RIE, baking was again carried out at 100° C. for 60 seconds and thereafter, ashing was carried out. As a result, the two-layered resist could be ashed without generating a residue of the resist.

EXAMPLE 16

In the procedures described in Examples 10 to 14, the laser beam irradiated the entire surface using the same KrF excimer laser stepper after O$_2$ RIE, baking was again carried out at 100° C. for 60 seconds, and PSG of the substrate was etched and was then ashed. As a result, the two-layered resist could be ashed without generating a residue of the resist.

COMPARATIVE EXAMPLE 4

In the procedures of Example 16 described above, ashing was carried out after etching of PSG without exposing the entire surface after O$_2$ RIE and the subsequent baking operation. As a result, a resist residue was formed, and ashing could not be carried out sufficiently.

As described above, the present invention provides a resist material which has high resolution and which can be developed by an aqueous alkali developing solution. Accordingly, the resist material can satisfy the requirements for miniature patterns in the semiconductor industry. Further, a thick lower layer resist can be etched by using a chemical amplification type resist consisting of a Si-containing methacrylate resin having high resolution and a photo-acid generator, and a pattern having a high aspect ratio can be obtained. The Si-containing resist can be peeled by a simple treatment.

We claim:

1. A process for forming a pattern comprising:

coating a resist material comprising a copolymer represented by the following formula I and a photo-acid generator,

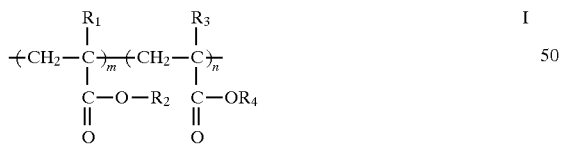

wherein each of R$_1$ and R$_3$ independently represents a hydrogen, C$_1$–C$_4$ alkyl, halogen, halogenated (C$_1$–C$_4$) alkyl, nitrile or phenyl, R$_2$ is a group represented by the following formula II,

wherein R$_5$ is a C$_1$–C$_4$ alkylene, and each of R$_6$, R$_7$ and R$_8$ independently represents a C$_1$–C$_4$ alkyl, halogenated (C$_1$–C$_4$) alkyl, phenyl or tri(C$_1$–C$_4$)alkylsilyl(C$_1$–C$_4$) alkyl, R$_4$ is a group which is eliminated by an acid, and each of m and n is a positive integer to a substrate to form a resist layer;

irradiating said resist layer;

baking said resist layer so irradiated; and developing said baked resist layer.

2. A process according to claim 1, wherein said resist material is coated on a lower layer resist layer formed in advance on said substrate to form an upper resist layer, said upper resist layer is irradiated, said irradiated upper resist layer is baked and then developed to form a pattern of said upper resist layer, and the patterned upper resist layer is used as a mask for said lower layer resist.

3. A process according to claim 2, wherein, after said upper resist layer pattern is formed, said upper resist layer is irradiated and then baked and thereafter said lower layer resist is etched to form a pattern.

4. A resist material comprising a copolymer and a photo-acid generator, said copolymer being represented by the following formula I:

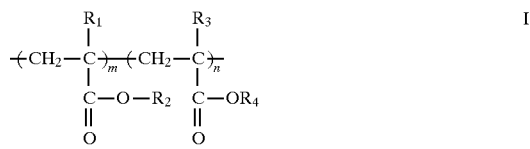

wherein each of R$_1$ and R$_3$ independently represents hydrogen, a C$_1$–C$_4$ alkyl group, a halogen group, a halogenated C$_1$–C$_4$ alkyl group, a nitrile group or a phenyl group;

wherein R$_2$ is a group represented by the following formula II:

wherein R$_5$ is a C$_1$–C$_4$ alkylene group, and each of R$_6$, R$_7$ and R$_8$ independently represents a C$_1$–C$_4$ alkyl group, a halogenated C$_1$–C$_4$ alkyl group, a phenyl group or a trialkylsilylalkyl group in which each said alkyl substituent is a C$_1$–C$_4$ alkyl group;

wherein R$_4$ is a group which is eliminated by the acid generated by the photo-acid generator;

wherein each of m and n is a positive integer; and wherein the elimination of the R$_4$ group by the acid converts polarity of the material, rendering the material soluble in an aqueous alkali solution.

5. A resist material as set forth in claim 4, wherein the group as R$_4$ is selected from t-butyl, dimethylbenzyl, tetrahydropyranyl and 3-oxocyclohexyl.

6. A resist material as set forth in claim 4, wherein the photo-acid generator is selected from the group consisting of:

sulfonium salts of the formula,

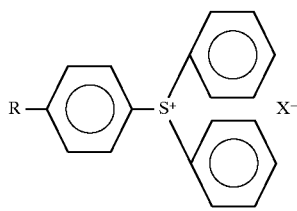

in which $X^-$ is $BF_4^-$, $PF_6^-$, $SbF_6^-$ or $CF_3SO_3^-$, and R is —H, —OCH$_3$ or

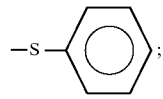

sulfonic acid ester compounds of the formulae,

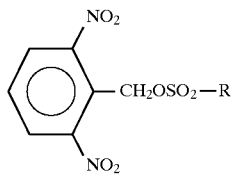

in which R is

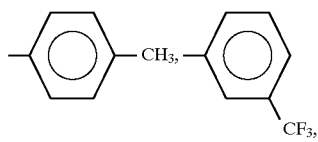

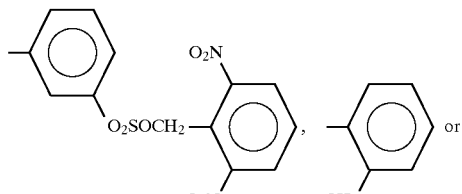

in which $R_1$ is —H or —CH$_3$, and $R_2$ is —C$_4$H$_9$,

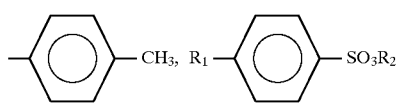

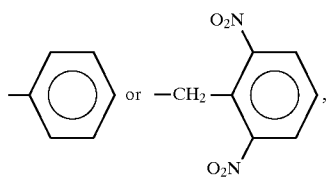

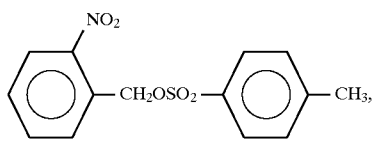

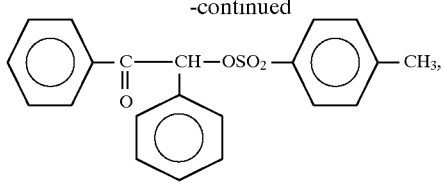

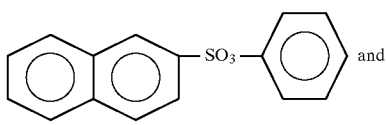

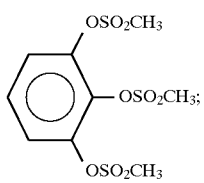

iodonium salts of the formula,

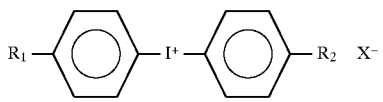

in which $X^-$ is $BF_4^-$, $PF_6^-$, $SbF_6^-$ or $CF_3SO_3^-$, and $R_1$ and $R_2$ are each independently —H, —OCH$_3$ or —C(CH$_3$); and halogen compounds of the formulae,

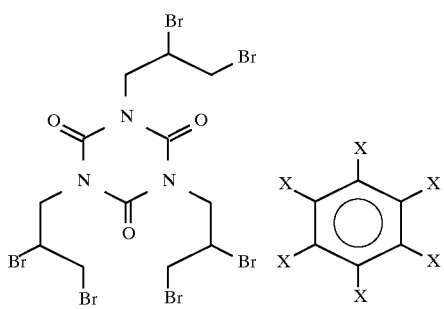

in which X is —Br or —Cl,

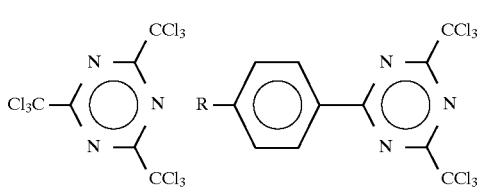

in which R is —H, —C$_1$ or —OCH$_3$.

* * * * *